(12) United States Patent
Nielsen et al.

(10) Patent No.: US 11,990,755 B2
(45) Date of Patent: May 21, 2024

(54) METHOD FOR DETECTING POWER OSCILLATION IN AN ELECTRIC POWER GRID

(71) Applicant: VESTAS WIND SYSTEMS A/S, Aarhus (DK)

(72) Inventors: Per Hagen Nielsen, Tilst (DK); Lennart Petersen, Aarhus (DK); Germán Claudio Tarnowski, Aarhus (DK)

(73) Assignee: VESTAS WIND SYSTEMS A/S, Aarhus (DK)

( * ) Notice: Subject to any disclaimer, the term of this patent is extended or adjusted under 35 U.S.C. 154(b) by 0 days.

(21) Appl. No.: 18/305,055

(22) Filed: Apr. 21, 2023

(65) Prior Publication Data
US 2023/0344231 A1 Oct. 26, 2023

(30) Foreign Application Priority Data
Apr. 21, 2022 (DK) .......................... PA 2022 70209

(51) Int. Cl.
*H02J 3/24* (2006.01)
*G01R 19/04* (2006.01)
*G01R 19/10* (2006.01)

(52) U.S. Cl.
CPC .............. *H02J 3/241* (2020.01); *G01R 19/04* (2013.01); *G01R 19/10* (2013.01)

(58) Field of Classification Search
CPC .......... H02J 3/241; G01R 19/04; G01R 19/10
(Continued)

(56) References Cited

U.S. PATENT DOCUMENTS

| 4,607,217 A | 8/1986 | Bhargava |
| 5,739,652 A | 4/1998 | Sriram |

(Continued)

FOREIGN PATENT DOCUMENTS

| CN | 104967133 A | 10/2015 |
| CN | 109462242 B | 1/2021 |
| EP | 3872502 A1 | 9/2021 |

OTHER PUBLICATIONS

Danish Patent and Trademark Office, 1st Technical Examination including The Search Report for Application PA 2022 70209 dated Oct. 19, 2022.

(Continued)

*Primary Examiner* — Hal Kaplan
(74) *Attorney, Agent, or Firm* — Patterson + Sheridan, LLP

(57) ABSTRACT

A method for detecting power oscillation in an electric power grid, wherein the method comprises: integrating a filtered signal on a first interval, the filtered signal being associated with the electric power grid; based on the integration of the filtered signal on the first interval, determining a positive half-period area of the filtered signal and a negative half-period area of the filtered signal, one of the positive half-period area and negative half-period area being immediately subsequent to the other one; and determining that a power oscillation in the electric power grid is detected if the following two conditions are met:
  a sum of the positive half-period area of the filtered signal and the negative half-period area of the filtered signal is below a first threshold; and
  the absolute value of one of the positive half-period area and negative half-period area is above a second threshold.

16 Claims, 12 Drawing Sheets

(58) Field of Classification Search
USPC .......................................................... 307/102
See application file for complete search history.

(56) References Cited

U.S. PATENT DOCUMENTS

| | | |
|---|---|---|
| 11,495,969 B2 * | 11/2022 | Rebizant .......... G01R 19/16547 |
| 2005/0258855 A1 | 11/2005 | Kimura |
| 2013/0099582 A1 | 4/2013 | Ray et al. |
| 2021/0159705 A1 | 5/2021 | Busker et al. |
| 2021/0265840 A1 * | 8/2021 | Rebizant ................... H02J 3/26 |
| 2021/0281071 A1 | 9/2021 | Schwanka Trevisan |

OTHER PUBLICATIONS

1 European Patent Office, extended European Search Report for Application 23168641.1-1202 dated Sep. 23, 2023.

* cited by examiner

METHOD FOR DETECTING POWER OSCILLATION IN AN ELECTRIC POWER GRID

TECHNICAL FIELD

Aspects of the present invention relate to a method for detecting power oscillation in an electric power grid.

BACKGROUND

In general, an electric power grid based on synchronous generators and alternating voltage, for example referred to as a utility grid, may have defined parameters, for example a defined alternating voltage frequency, such as 50 Hz or 60 Hz. The stability of the electric power grid parameters, including the load angle of synchronous generators, is dependent on a variety of variables including the balance between generated electric power and consumed electric power in the electric power grid. In general, any imbalance between generated electric power and consumed electric power results in changes in the grid frequency of the electric power grid. In general, it is important to have a stable grid frequency in the electric power grid.

Further, power oscillation, or electromechanical oscillation of the load angle of synchronous generators, in general referred to as inter area oscillation, may occur in the electric power grid, which in general has a negative impact on the stability of the electric power grid parameters.

In general, a grid code may be specified for an electric power grid, for example by the electric power grid operator, wherein the grid code defines parameters a power plant connected to the electric power grid has to meet, such as a power plant including one or more wind turbine generators, for example to provide sufficient frequency support to the electric power grid, to provide sufficient voltage support to the electric power grid, or to provide sufficient power oscillation damping support to the electric power grid.

SUMMARY

The inventors of the present invention have found drawbacks in conventional solutions for detecting power oscillation in electric power grids so as to provide power oscillation damping support to the electric power grid when power oscillation is detected. For example, some conventional solutions do not provide a sufficiently efficient detection of power oscillation in electric power grids.

An object of the invention is to provide a solution which mitigates or solves the drawbacks and problems of conventional solutions.

The above and further objects are solved by the subject matter of the independent claims. Further advantageous embodiments of the invention can be found in the dependent claims.

According to a first aspect of the invention, the above mentioned and other objects are achieved with a method for detecting power oscillation in an electric power grid, wherein the method comprises:
  integrating a filtered signal on a first interval, the filtered signal being associated with the electric power grid;
  based on the integration of the filtered signal on the first interval, determining a positive half-period area of the filtered signal and a negative half-period area of the filtered signal, one of the positive half-period area and negative half-period area being immediately subsequent to the other one of the positive half-period area and negative half-period area; and
  determining that a power oscillation in the electric power grid is detected if the following two conditions, or criterion, are met:
    a sum of the positive half-period area of the filtered signal and the negative half-period area of the filtered signal is below a first threshold; and
    the absolute value of one of the positive half-period area and negative half-period area is above a second threshold.

An advantage of the method according to the first aspect is that an improved detection of power oscillation in electric power grids is provided. An advantage of the method according to the first aspect is that a fast detection of power oscillation in electric power grids is provided. An advantage of the method according to the first aspect is that power oscillation in the electric power grid is detected sufficiently fast and with an improved reliability in relation to conventional solutions, so as to quickly start damping the power oscillation when detected. It is not desirable to erroneously detect power oscillation in the electric power grid and as a consequence start a process for damping power oscillation without any presence of true power oscillation in the electric power grid. Thus, false power oscillation detection is to be avoided. At the same time, the detection of power oscillation in the electric power grid cannot to be too slow, for example in view of certain grid codes.

An advantage of the method according to the first aspect is that the detection method is efficient for multiple mixed frequencies. For example, the method according to the first aspect is more efficient and reliable in relation to conventional solutions relying on zero crossing detection, for example conventional solutions looking for particular frequencies by way of zero crossing detection. For example, conventional solutions relying on zero crossing detection cannot detect oscillations in mixed mode if multiple mixed frequencies occur.

It is to be understood that the fact that one of the positive half-period area and negative half-period area is immediately subsequent to the other one of the positive half-period area and negative half-period area implies that there is no other half-period area therebetween, or between them.

For some embodiments, the filtered signal may comprise one of the group of:
  a filtered voltage signal; and
  a filtered frequency signal.

According to an advantageous embodiment of the method according to the first aspect, the first interval has a duration in the range of 9 to 15 seconds, such as in the range of 9 to 12.5 seconds, for example in the range of 9 to 11 seconds. An advantage of this embodiment is that a further improved detection of power oscillation in electric power grids is provided.

According to another advantageous embodiment of the method according to the first aspect, the method comprises:
  integrating the filtered signal on a second interval; and
  based on the integrations of the filtered signal on the first and second intervals, determining the positive half-period area of the filtered signal and the negative half-period area of the filtered signal.

An advantage of this embodiment is that a further improved detection of power oscillation in electric power grids is provided. An advantage of this embodiment is that the reliability of the power oscillation detection in the electric power grid is further improved, or enhanced, while the power oscillation detection in the electric power grid is sufficiently fast.

According to yet another advantageous embodiment of the method according to the first aspect, the second interval has a duration in the range of 5 to 7 seconds. An advantage of this embodiment is that a further improved detection of power oscillation in electric power grids is provided.

According to a further advantageous embodiment of the method according to the first aspect, the method comprises:
integrating the filtered signal on a third interval; and
based on the integrations of the filtered signal on the first, second and third intervals, determining the positive half-period area of the filtered signal and the negative half-period area of the filtered signal.

An advantage of this embodiment is that a further improved detection of power oscillation in electric power grids is provided. An advantage of this embodiment is that the reliability of the power oscillation detection in the electric power grid is further improved while the power oscillation detection in the electric power grid is sufficiently fast.

According to another advantageous embodiment of the method according to the first aspect, the third interval has a duration in the range of 2 to 3 seconds. An advantage of this embodiment is that a further improved detection of power oscillation in electric power grids is provided.

According to yet another advantageous embodiment of the method according to the first aspect, the method comprises:
integrating the filtered signal on a fourth interval; and
based on the integrations of the filtered signal on the first, second, third and fourth intervals, determining the positive half-period area of the filtered signal and the negative half-period area of the filtered signal.

An advantage of this embodiment is that a further improved detection of power oscillation in electric power grids is provided. An advantage of this embodiment is that the reliability of the power oscillation detection in the electric power grid is further improved while the power oscillation detection in the electric power grid is sufficiently fast.

According to still another advantageous embodiment of the method according to the first aspect, the fourth interval has a duration in the range of 0.1 to 1 second. An advantage of this embodiment is that a further improved detection of power oscillation in electric power grids is provided.

According to an advantageous embodiment of the method according to the first aspect, the method comprises:
integrating the filtered signal on a third interval;
integrating the filtered signal on a fourth interval; and
based on the integrations of the filtered signal on the first, second, third and fourth intervals, determining the positive half-period area of the filtered signal and the negative half-period area of the filtered signal.

An advantage of this embodiment is that a further improved detection of power oscillation in electric power grids is provided. An advantage of this embodiment is that the reliability of the power oscillation detection in the electric power grid is further improved while the power oscillation detection in the electric power grid is sufficiently fast.

According to a further advantageous embodiment of the method according to the first aspect, the third interval has a duration in the range of 2 to 3 seconds, wherein the fourth interval has a duration in the range of 0.1 to 1 second. An advantage of this embodiment is that a further improved detection of power oscillation in electric power grids is provided.

According to another advantageous embodiment of the method according to the first aspect, the method comprises:
controlling a first integrator to integrate the filtered signal on the first interval.

An advantage of this embodiment is that a further improved detection of power oscillation in electric power grids is provided.

According to yet another advantageous embodiment of the method according to the first aspect, the method comprises:
controlling a second integrator to integrate the filtered signal on the second interval.

An advantage of this embodiment is that a further improved detection of power oscillation in electric power grids is provided.

According to still another advantageous embodiment of the method according to the first aspect, the method comprises:
controlling a third integrator to integrate the filtered signal on the third interval.

An advantage of this embodiment is that a further improved detection of power oscillation in electric power grids is provided.

According to an advantageous embodiment of the method according to the first aspect, the method comprises:
controlling a fourth integrator to integrate the filtered signal on the fourth interval.

An advantage of this embodiment is that a further improved detection of power oscillation in electric power grids is provided.

According to a further advantageous embodiment of the method according to the first aspect, the method comprises one or more of the steps of:
controlling a first integrator to integrate the filtered signal on the first interval;
controlling a second integrator to integrate the filtered signal on the second interval;
controlling a third integrator to integrate the filtered signal on the third interval; and
controlling a fourth integrator to integrate the filtered signal on the fourth interval.

An advantage of this embodiment is that a further improved detection of power oscillation in electric power grids is provided. An advantage of this embodiment is that the reliability of the power oscillation detection in the electric power grid is further improved while the power oscillation detection in the electric power grid is sufficiently fast.

According to another advantageous embodiment of the method according to the first aspect, the method comprises:
determining a peak value of the filtered signal on one or more of the first, second, third and fourth intervals; and
determining that a power oscillation in the electric power grid is detected if the following three conditions are met:
the determined peak value is above a third threshold;
the sum of the positive half-period area of the filtered signal and the negative half-period area of the filtered signal is below the first threshold; and
the absolute value of one of the positive half-period area and negative half-period area is above the second threshold.

An advantage of this embodiment is that a further improved detection of power oscillation in electric power grids is provided. An advantage of this embodiment is that a fast detection of power oscillation in electric power grids is provided. An advantage of this embodiment is that the reliability of the power oscillation detection in the electric power grid is further improved while the power oscillation detection in the electric power grid is sufficiently fast.

According to yet another advantageous embodiment of the method according to the first aspect, the duration of one of the first, second, third and fourth intervals is different from the duration of another one of the first, second, third and fourth intervals. An advantage of this embodiment is that a further improved detection of power oscillation in electric power grids is provided. An advantage of this embodiment is that a fast detection of power oscillation in electric power grids is provided. An advantage of this embodiment is that the reliability of the power oscillation detection in the electric power grid is further improved while the power oscillation detection in the electric power grid is sufficiently fast.

According to an advantageous embodiment of the method according to the first aspect, the method is performed two or more consecutive times,
wherein the method comprises:
if the conditions are met every time the method is performed, determining that a power oscillation in the electric power grid is detected.

An advantage of this embodiment is that a further improved detection of power oscillation in electric power grids is provided. An advantage of this embodiment is that a fast detection of power oscillation in electric power grids is provided. An advantage of this embodiment is that the reliability of the power oscillation detection in the electric power grid is further improved while the power oscillation detection in the electric power grid is sufficiently fast.

According to a further advantageous embodiment of the method according to the first aspect, wherein the method comprises:
if one or more of the conditions is/are no longer met, determining the cease of power oscillation in the electric power grid.

An advantage of this embodiment is that a further improved detection of power oscillation in electric power grids is provided. An advantage of this embodiment is that any process for damping power oscillation in an electric power grid can quickly be stopped so as to instead proceed with other control schemes, for example in order to fulfil other requirements of the grid code, such as to provide sufficient frequency support and/or sufficient voltage support to the electric power grid.

According to another advantageous embodiment of the method according to the first aspect, the method comprises:
if an electric power injected to the electric power grid so as to dampen power oscillation in the electric power grid is below a fourth threshold, determining the cease of power oscillation in the electric power grid.

An advantage of this embodiment is that a further improved detection of power oscillation in electric power grids is provided. An advantage of this embodiment is that any process for damping power oscillation in an electric power grid can quickly be stopped so as to instead proceed with other control schemes, for example in order to fulfil other requirements of the grid code. For some embodiments, the electric power may comprise active and/or reactive power.

According to still another advantageous embodiment of the method according to the first aspect, the method comprises:
detecting power oscillation at a point of common coupling between the electric power grid and a power plant connected to the electric power grid, wherein the power plant comprises one or more electric power generating units.

According to a further advantageous embodiment of the method according to the first aspect, the method comprises:
determining the sum of the positive half-period area of the filtered signal and the negative half-period area of the filtered signal.

According to another advantageous embodiment of the method according to the first aspect, the method comprises:
comparing the positive half-period area of the filtered signal with the negative half-period area of the filtered signal so as to obtain, or form, the sum of the positive half-period area of the filtered signal and the negative half-period area of the filtered signal.

According to yet another advantageous embodiment of the method according to the first aspect, the method comprises:
performing an addition of the positive half-period area of the filtered signal and the negative half-period area of the filtered signal so as to obtain the sum of the positive half-period area of the filtered signal and the negative half-period area of the filtered signal.

According to an advantageous embodiment of the method according to the first aspect, the method comprises:
measuring or detecting a signal, for example a voltage signal or a frequency signal, to be filtered to the filtered signal, the signal being associated with the electric power grid.

According to a further advantageous embodiment of the method according to the first aspect, the method comprises:
measuring or detecting the signal at a point of common coupling between the electric power grid and a power plant connected to the electric power grid, wherein the power plant comprises one or more electric power generating units.

According to another advantageous embodiment of the method according to the first aspect, the method comprises:
filtering a signal associated with the electric power grid so as to produce the filtered signal.

According to yet another advantageous embodiment of the method according to the first aspect, one or more of the one or more electric power generating units comprises/comprise one or more of the group of:
a wind turbine generator;
an electric battery energy storage system;
a fuel cell; and
a photo-voltaic panel.

According to a second aspect of the invention, the above mentioned and other objects are achieved with a process for damping power oscillation in an electric power grid, wherein the process comprises:
performing a method according to any one of the embodiments disclosed above or below; and
if power oscillation is determined to be detected in the electric power grid, injecting electric power to the electric power grid so as to dampen the power oscillation.

An advantage of the process according to the second aspect is that an improved power oscillation damping in electric power grids is provided.

According to a third aspect of the invention, the above mentioned and other objects are achieved with a computer program comprising instructions which, when the program is executed by a computer, cause the computer to carry out one or more of the method according to any one of the embodiments disclosed above or below and process according to any one of the embodiments disclosed above or below. Advantages of the computer program according to the second aspect correspond to advantages of the method according to the first aspect and its embodiments mentioned above or below.

For some embodiments, the above mentioned and other objects are achieved with a computer program comprising instructions which, when the program is executed by a computer, cause the computer to carry out the method according to any one of the embodiments mentioned above or below.

According to a fourth aspect of the invention, the above mentioned and other objects are achieved with a computer-readable medium comprising instructions which, when the instructions are executed by a computer, cause the computer to carry out one or more of the method according to any one of the embodiments disclosed above or below and process according to any one of the embodiments disclosed above or below. Advantages of the computer-readable medium according to the third aspect correspond to advantages of the method according to the first aspect and its embodiments mentioned above or below.

For some embodiments, the above mentioned and other objects are achieved with a computer-readable medium comprising instructions which, when the instructions are executed by a computer, cause the computer to carry out the method according to any one of the embodiments mentioned above or below.

According to an aspect of the present invention, the above-mentioned computer program and/or the computer-readable medium are/is configured to implement the method and its embodiments described herein.

According to a fifth aspect of the invention, the above mentioned and other objects are achieved with a control arrangement for detecting power oscillation in an electric power grid, wherein the control arrangement is configured to:
   integrate a filtered signal on a first interval, the filtered signal being associated with the electric power grid;
   based on the integration of the filtered signal on the first interval, determine a positive half-period area of the filtered signal and a negative half-period area of the filtered signal, one of the positive half-period area and negative half-period area being immediately subsequent to the other one of the positive half-period area and negative half-period area; and
   determine that a power oscillation in the electric power grid is detected if the following two conditions are met:
   a sum of the positive half-period area of the filtered signal and the negative half-period area of the filtered signal is below a first threshold; and
   the absolute value of one of the positive half-period area and negative half-period area is above a second threshold.

Advantages of the control arrangement according to the fifth aspect correspond to advantages of the method according to the first aspect and its embodiments mentioned above or below.

It is to be appreciated that all the embodiments described for the method aspects of the invention are applicable also to the control arrangement aspects of the invention. Thus, all embodiments described for the method aspects of the invention may be performed by the control arrangement, which may include one or more controllers, control units, or control devices. As mentioned above, the embodiments of the control arrangement have advantages corresponding to advantages mentioned above for the method and its embodiments.

According to a sixth aspect of the invention, the above mentioned and other objects are achieved with a power plant for providing electric power to an electric power grid, wherein the power plant comprises
   one or more electric power generating units, and
   a control arrangement according to any one of the embodiments disclosed above or below.

Advantages of the power plant according to the sixth aspect correspond to advantages of the method according to the first aspect and its embodiments mentioned above or below.

According to an advantageous embodiment of the power plant according to the sixth aspect, one or more of the one or more electric power generating units comprises/comprise one or more of the group of:
   a wind turbine generator;
   an electric battery energy storage system;
   a fuel cell; and
   a photo-voltaic panel.

The above-mentioned features and embodiments of the method, the process, the computer program, the computer-readable medium, the control arrangement and the power plant, respectively, may be combined in various possible ways providing further advantageous embodiments.

Further advantageous embodiments of the method, the process, the computer program, the computer-readable medium, the control arrangement and the power plant according to the present invention and further advantages with the embodiments of the present invention emerge from the detailed description of embodiments.

BRIEF DESCRIPTION OF THE DRAWINGS

Embodiments of the invention will now be illustrated, for exemplary purposes, in more detail by way of embodiments and with reference to the enclosed drawings, where similar references are used for similar parts, in which.

DETAILED DESCRIPTION

Figure 1:
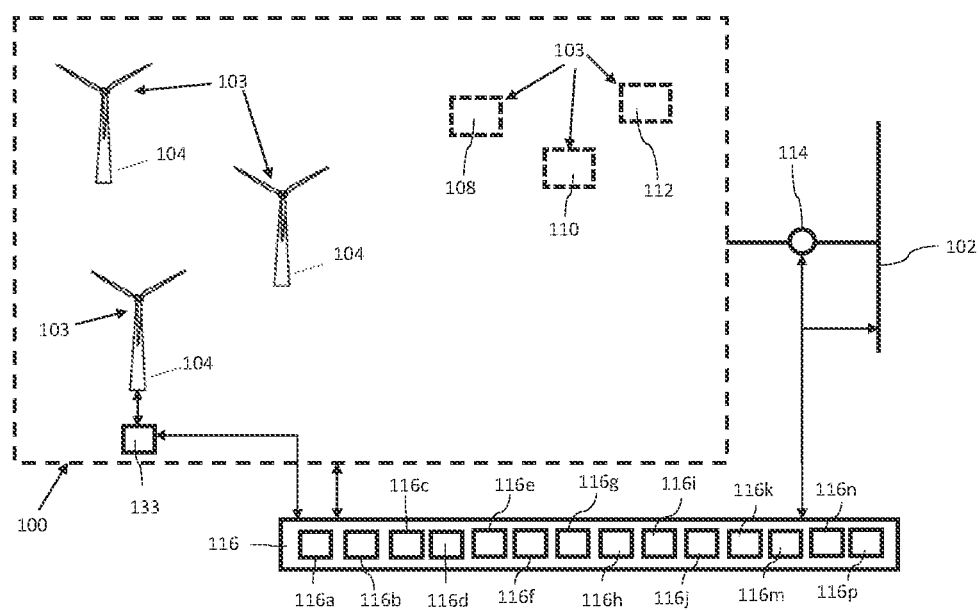
FIG. 1 is a schematic diagram illustrating embodiments of the power plant according to the sixth aspect of the invention and an electric power grid, to which embodiments of the method according to the first aspect of the invention may be applied.

With reference to FIG. 1, an embodiment of the power plant 100 for providing electric power, or electrical energy, to an electric power grid 102 according to the sixth aspect of the invention is schematically illustrated. For example, embodiments of the method according to the first aspect of the invention may be applied to the electric power grid 102 illustrated in FIG. 1. However, embodiments of the method according to the first aspect may also be applied to other electric power grids. The power plant 100 includes one or more electric power generating units 103. For some embodiments, one or more of the one or more electric power generating units 103 may include one or more of the group of: a wind turbine generator 104; an electric battery energy storage system 112; a photo-voltaic panel 108; and a fuel cell 110. The electric battery energy storage system 112 may include one or more electric battery units. For some embodiments, the power plant 100 may include one or more additional power sources or power generators, such as one or more additional electric battery units. Thus, for some embodiments, the power plant 100 may include one or more wind turbine generators 104, for example two, three or more wind turbine generators 104. Aspects of an embodiment of the wind turbine generator 104 are disclosed in further detail hereinbelow in connection with FIG. 2.

With reference to FIG. 1, for some embodiments, the wind turbine generator 104, the electric battery energy storage system 112, the photo-voltaic panel 108, or the fuel cell 110 may be described as a power source of the power plant 100 or as a power generator of the power plant 100. For some embodiments, the power plant 100 may be referred to as a hybrid power plant. The power plant 100 may be connected, or connectable, to the electric power grid 102 via a point of common coupling, PCC, 114. For some embodiments, the electric power grid 102 may be referred to as a utility grid, an electrical grid, or an electric power network. For example, the power plant 100 may be located offshore or on land.

With reference to FIG. 1, the power plant 100 includes a control arrangement 116 according to any one of the embodiments disclosed above or below and/or according to the fifth aspect of the invention. For some embodiments, the control arrangement 116 may be configured to control the power plant 100. For some embodiments, the control arrangement 116 may comprise, or be referred to as, a power plant controller, PPC. The control arrangement 116 is further disclosed hereinbelow.

Figure 2:
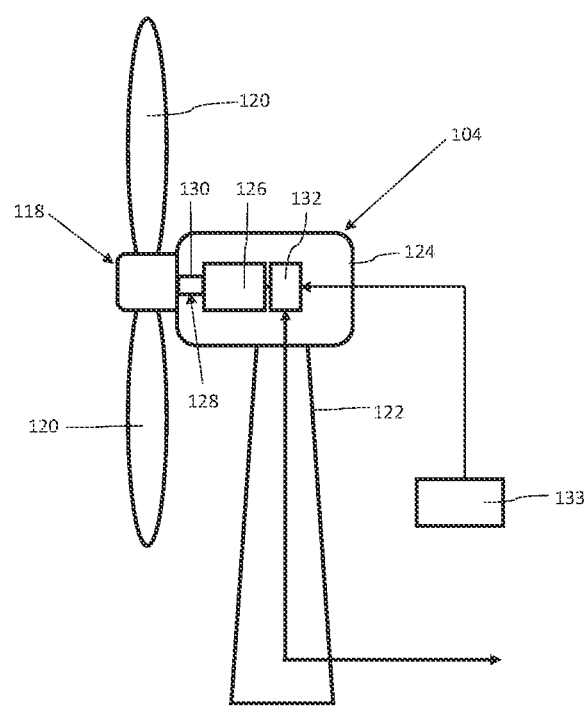
FIG. 2 is a schematic diagram illustrating an embodiment of a wind turbine generator of the power plant of FIG. 1.

With reference to FIG. 2, an embodiment of the wind turbine generator 104 of the power plant 100 of FIG. 1 is schematically illustrated. The wind turbine generator 104 may comprise a rotor 118 including one or more blades 120, or rotor blades 120, for example two or more blades 120, such as three blades 120, or more. The wind turbine generator 104 may comprise a tower 122 and a nacelle 124 mounted to the top of the tower 122. The rotor 118 may be connected, such as rotatably connected or mounted, to the nacelle 124. The wind turbine generator 104 may comprise an electric generator 126 to which the rotor 118 is connected. The rotor 118 is configured to drive the electric generator 126. The nacelle 124 may house the electric generator 126.

With reference to FIG. 2, the rotor 118 is rotatable by action of the wind. The wind-induced rotational energy of the blades 120 and rotor 118 may be transferred via a coupling 128, for exampling including one or more shafts 130, to the electric generator 126. Thus, the wind turbine generator 104 may be described to be configured to convert kinetic energy of the wind to mechanical energy, or rotational energy, by way of the blades 120 and, subsequently, to electric power by way of the electric generator 126. The wind turbine generator 104 may comprise one or more power converters 132 connected to the electric generator 126. The wind turbine generator 104 and/or the electric generator 126 may be connected to the electric power grid 102 via said one or more power converters 132. The one or more power converters 132 may comprise a first power converter for converting AC power from the electric generator 126 to DC power. The one or more power converters 132 may comprise a second power converter for converting DC power from the first power converter to AC power to be provided to the electric power grid 102. The nacelle 124 may house the one or more power converters 132, or the one or more power converters 132 may be located elsewhere.

With reference to FIG. 2, the wind turbine generator 104 may comprises a control arrangement 133 for controlling the wind turbine generator 104. The control arrangement 133 of the wind turbine generator 104 may comprise a wind turbine generator controller. The control arrangement 133 of the wind turbine generator 104 may be configured to communicate with and/or be connected to, or be part of, the control arrangement 116 of the power plant 100. For some embodiments, the wind turbine generator 104 may be referred to as a variable-speed wind turbine generator. It is to be understood that the wind turbine generator 104 may include further unites, components and/or devices, such as sensors, required for a wind turbine generator 104.

Figure 3:
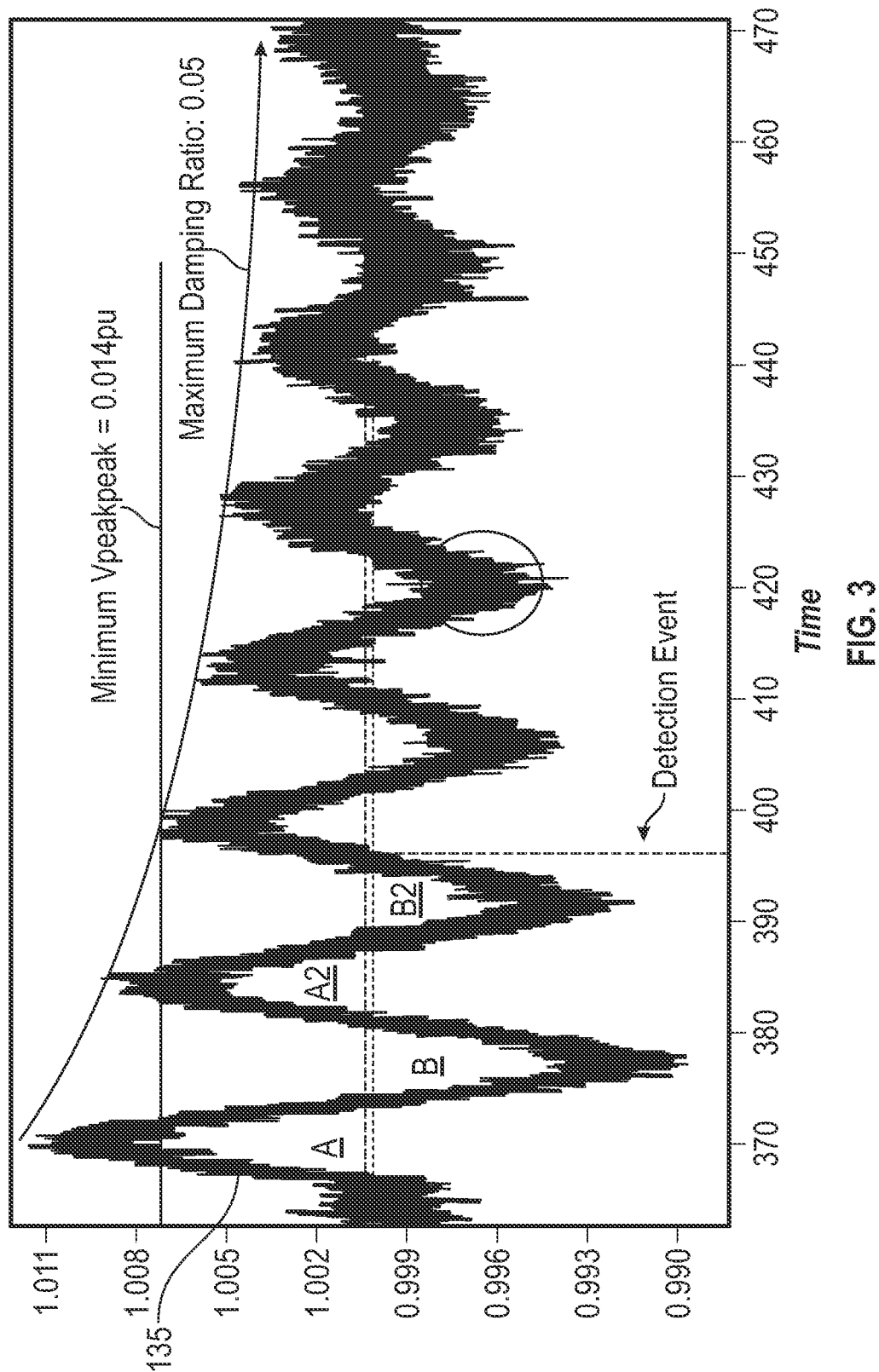
FIG. 3 is a schematic diagram including a schematic graph illustrating power oscillation in an electric power grid.

FIG. 3 shows a schematic diagram including a schematic graph illustrating power oscillation in an electric power grid 102. The wave-shaped signal 135 illustrated in FIG. 3 is associated with an electric power grid 102. More specifically, in FIG. 3, the wave-shaped signal 135 represents a signal which has been measured at a point of common coupling, PCC, 114 between the electric power grid 102 and a power plant 100 connected to the electric power grid 102. In FIG. 3, the signal 135 is a voltage signal. However, in alternative schematic diagrams illustrating power oscillation, the signal 135 may be a frequency signal. However, the signal 135 could represent any measured physical magnitude or quantity, such as any electrical or mechanical signal. In FIG. 3, the signal 135 has a maximum damping rate of 0.05 and a minimum voltage$_{peak-to-peak}$ of 0.014 pu. However, for other cases, other maximum damping rates and other minimum voltages$_{peak-to-peak}$ are possible.

Figure 11:
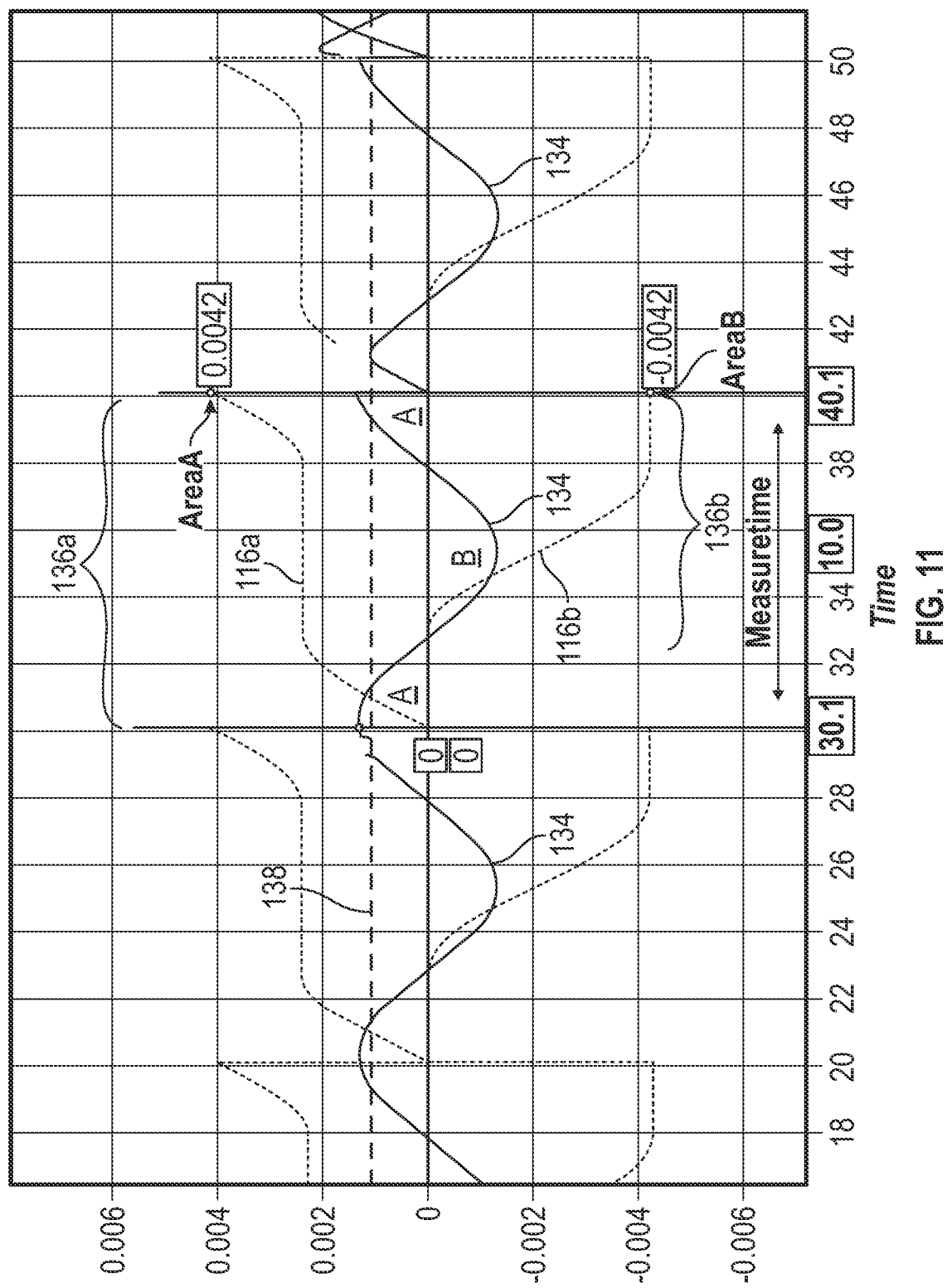
FIG. 11 is a schematic diagram including schematic graphs illustrating aspects of embodiments of the method according to the first aspect of the invention.

FIG. 11 shows a schematic diagram including schematic graphs illustrating aspects of embodiments of the method according to the first aspect of the invention. The wave-shaped signal 134 illustrated in FIG. 11 is associated with an electric power grid 102. More specifically, in FIG. 11, the wave-shaped signal 134 represents a signal which has been measured at a point of common coupling, PCC, 114 between the electric power grid 102 and a power plant 100 connected to the electric power grid 102 and thereafter has been filtered. Thus, the wave-shaped signal 134 in FIG. 11 represents a filtered signal. In FIG. 11, the filtered signal 134 has been filtered to capture power oscillation in the requirement range of 0.1 to 2 Hz. For some embodiments, it may be defined that a signal 135 (see FIG. 3) associated with the electric power grid 102 is filtered into the filtered signal 134 so as to capture power oscillation in the requirement range of 0.1 to 2 Hz. For other embodiments, the signal 135 associated with the electric power grid 102 may be filtered into the filtered signal 134 so as to capture power oscillation in the requirement range of 0.1 to 1 Hz, or 0.1 to 2.5 Hz, or any other range, which, for example, may be specified by the grid code for an electric power grid 102. In FIG. 11, the filtered signal 134 has been filtered to have a balance point at zero pu.

With reference to FIGS. 3 to 9 and 11, aspects of embodiments of the method for detecting power oscillation, or power oscillations, in an electric power grid 102 according to the first aspect of the invention are schematically illustrated. For some embodiments, the electric power grid 102 may be connected, or connectable, to a power plant 100, for example according to any one of the embodiments disclosed above.

Figure 4:
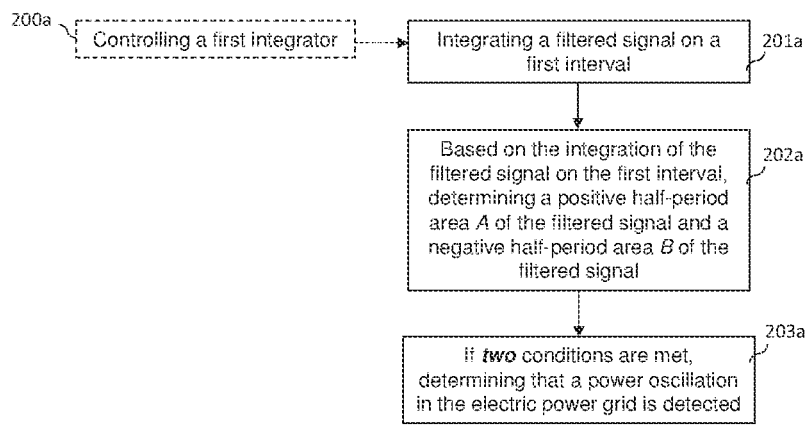
FIG. 4 is a schematic flow chart illustrating aspects of embodiments of the method according to the first aspect of the invention.

With reference to FIGS. 4 and 11, embodiments of the method include the steps of:
  integrating 201a a filtered signal 134 on, or over, a first interval 136a (see FIG. 11), wherein the filtered signal 134 is associated with the electric power grid 102;
  based on the integration of the filtered signal 134 on the first interval 136a, determining 202a a positive half-period area A of the filtered signal 134 and a negative half-period area B of the filtered signal 134, wherein one B of the positive half-period area A and negative half-period area B is immediately subsequent to the other one A of the positive half-period area A and negative half-period area B; and
  determining 203a that a power oscillation in the electric power grid 102 is detected if the following two conditions (or criterion) are met (or valid):
    a sum of the positive half-period area A of the filtered signal 134 and the negative half-period area B of the filtered signal 134 is below a first threshold; and
    the absolute value of one A, B of the positive half-period area A and negative half-period area B is above a second threshold.

It is to be understood that the fact that one B of the positive half-period area A and negative half-period area B is immediately subsequent to the other one A of the positive half-period area A and negative half-period area B implies that there is no other half-period area between them A, B, or in between. It is to be understood that one B of the positive half-period area A and negative half-period area B is always negative, more specifically, the negative half-period area B is always negative. Thus, the sum of the positive half-period area A of the filtered signal 134 and the negative half-period area B of the filtered signal 134=(+)A+(−)B. In FIG. 11, the negative half-period area B of the filtered filtered signal 134 is below the balance point at zero pu, or below the zero line. With reference to FIG. 11, for some embodiments, it may be described that the integration will become negative, or an integrator 116b will end up with a negative value or a negative integration (for example −0.0042 as illustrated in FIG. 11, or any other negative value depending on the specific filtered signal), when integrating the filtered signal 134 to obtain the negative half-period area B of the filtered filtered signal 134. If the positive half-period area A is equal to the negative half-period area B, said sum will be zero. For some embodiments, the positive half-period area A or the negative half-period area B may be described as a definite integral. For some embodiments, the filtered signal 134 may be described as a wave-shaped signal 134, i.e. a signal 134 having a wave shape.

For some embodiments, power oscillation may be referred to as electromechanical oscillation of the load angle of synchronous generators, which in turn may be referred to as inter area oscillation, or intra area oscillation, occurring among synchronous machines in the electric power grid. Such oscillations may produce extreme conditions in all electrical magnitudes, such as excessive electric currents in power lines, excessive electric power in power lines, over and under voltages, and over and under frequencies.

The inventors of the present invention have identified that power oscillation in an electric power grid 102 results in a signal 135 (see FIG. 3) having a wave shape which resembles a sine wave, or a sinusoidal wave/curve, however in general dampened over time, for example as schematically illustrated in FIG. 3. Thus, the inventors of the present invention have found that detecting a signal 135 having a wave shape which resembles a sine wave to a sufficiently high degree is an indication of power oscillation. When integrating a perfect sine wave, the positive half-period area of the sine wave is equal to the negative half-period area of the same sine wave. The inventors of the present invention have found that a positive half-period area A of a detected and filtered signal 134 being sufficiently similar to a negative half-period area B of the same signal 134 is an indication of power oscillation, i.e. that the sum of the positive half-period area A of the filtered signal 134 and the negative half-period area B of the filtered signal 134 is below a first threshold. Further, the inventors of the present invention have found that a wave shape of the detected and filtered signal 134 being sufficiently prominent is another indication of power oscillation, i.e. that the absolute value of one A, B of the positive half-period area A and negative half-period area B is above a second threshold. If the detected and filtered signal 134 is wave-shaped to a too low degree, i.e. if the wave shape is essentially too flat, in general there is no power oscillation present.

For some embodiments, the first threshold may be in the range of zero to 0.5 pu, for example 0.1 to 0.5 pu. For some embodiments, it may be defined that the first threshold is a value in the range of zero to 0.5 pu. For example, for some embodiments, the first threshold may be 0.3 pu. For some embodiments, the second threshold may be in the range of 0.001 to 0.015 pu, for example in the range of 0.002 to 0.007 pu, such as in the range of 0.002 to 0.005 pu. For some embodiments, it may be defined that the second threshold is a value in the range of 0.001 to 0.015 pu. For example, for some embodiments, the second threshold may be 0.003 pu. However, for other embodiments, other values and other ranges for the first and second thresholds are possible.

With reference to FIGS. 3, 4 and 11, for some embodiments, for filtering a signal 135 (see FIG. 3) associated with the electric power grid 102 so as to form the filtered signal 134 (see FIG. 11), a set of non-complex second order filters may be used. However, the signal 135 associated with the electric power grid 102 may be filtered in other manners. For some embodiments, the first interval 136a may have a duration in the range of 9 to 15 seconds, such as in the range of 9 to 12.5 seconds, for example in the range of 9 to 11 seconds. Expressed alternatively, the duration of the first interval 136a may be in the range of 9 to 15 seconds. For example, for some embodiments, the first interval 136a may have a duration of 11 seconds. However, for other embodiments, other values and other ranges for the first interval 136a are possible. For some embodiments, the method may include the step of controlling 200a a first integrator 116a (see FIGS. 1 and 11) to integrate the filtered signal 134 on the first interval 136a.

Figure 5:
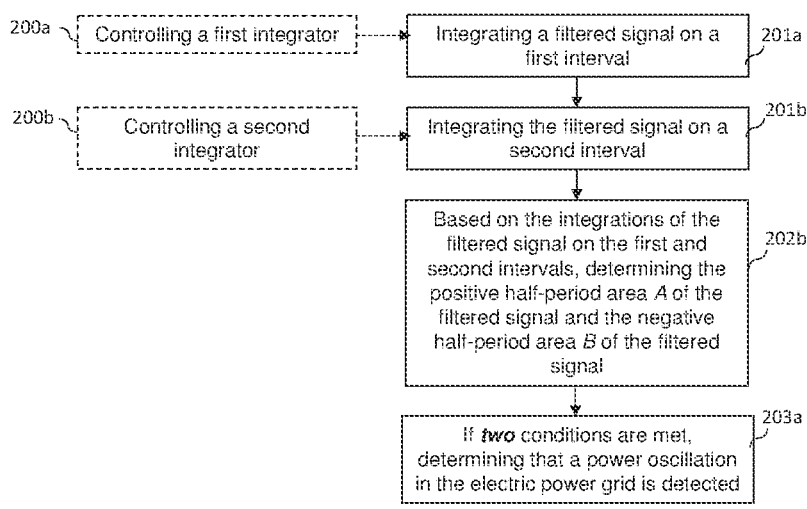
FIG. 5 is another schematic flow chart illustrating further aspects of embodiments of the method according to the first aspect of the invention.

With reference to FIGS. 3, 5 and 11, some embodiments of the method may include the steps of:
- integrating 201a the filtered signal 134 on the first interval 136a (see FIG. 11);
- integrating 201b the filtered signal 134 on a second interval 136b (see FIG. 11);
- based on the integrations of the filtered signal 134 on the first and second intervals 136a, 136b, determining 202b the positive half-period area A of the filtered signal 134 and the negative half-period area B of the filtered signal 134; and
- determining 203a that a power oscillation in the electric power grid 102 is detected if the following two conditions (or criterion) are met (or valid):
  - a sum of the positive half-period area A of the filtered signal 134 and the negative half-period area B of the filtered signal 134 is below a first threshold; and
  - the absolute value of one A, B of the positive half-period area A and negative half-period area B is above a second threshold.

With reference to FIGS. 5 and 11, for some embodiments, the second interval 136b may have a duration in the range of 5 to 7 seconds. For example, for some embodiments, the second interval 136b may have a duration of 6 seconds. However, for other embodiments, other values and other ranges for the second interval 136b are possible. For some embodiments, the method may include the step of controlling 200b a second integrator 116b (see FIGS. 1 and 11) to integrate the filtered signal 134 on the second interval 136b.

With reference to FIG. 11, the illustrated filtered signal 134, which may be a filtered voltage signal or a filtered frequency signal, is integrated by way of a first integrator 116a on the first interval 136a and integrated by way of a second integrator 116b on the second interval 136b. In FIG. 11, the duration of the first interval 136a is different from the duration of the second interval 136b. More specifically, in FIG. 11, the duration of the first interval 136a exceeds the duration of the second interval 136b. In FIG. 11, the first and second intervals 136a, 136b at least partly overlap.

Figure 6:
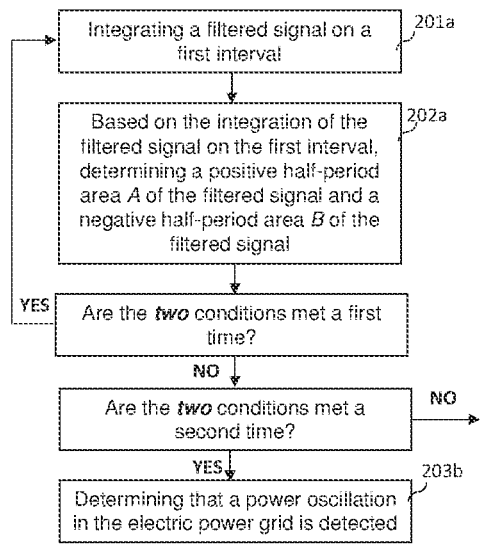
FIG. 6 is yet another schematic flow chart illustrating other aspects of embodiments of the method according to the first aspect of the invention.

With reference to FIG. 6, for some embodiments, one or more embodiments of the method may be performed two or more consecutive times,
wherein the method comprises:
- if the conditions are met every time the method is performed, determining 203b that a power oscillation in the electric power grid 102 is detected.

More specifically, for some embodiments, it may be defined the method is performed two or more consecutive times on the same filtered signal 134.

With reference to FIG. 6, more specifically, for some embodiments, the method checks if the positive half-period area A and the negative half-period area B are matching. If the positive half-period area A and the negative half-period area B match, there is an integral balance. Then, according to this embodiment, this integral balance should occur the next n times (n may be chosen from the range of zero to x, where x may be a number between 1 and 10, for example). A counter may represent this "next n times". If one of the checks for a match indicates no match when counting up to n, it is determined that no oscillation is detected. For this embodiment, all relevant conditions should be met for the counter to be incremented. The counter is not necessary but can help removing some false detections. For some embodiments, when a relevant condition is not meet, an additional timer can hold a detection event signal high, for example for 100 seconds, or for any other time period, so as to not determine that no oscillation is detected when being close to meet a relevant condition in case of a noisy signal.

Figure 7:
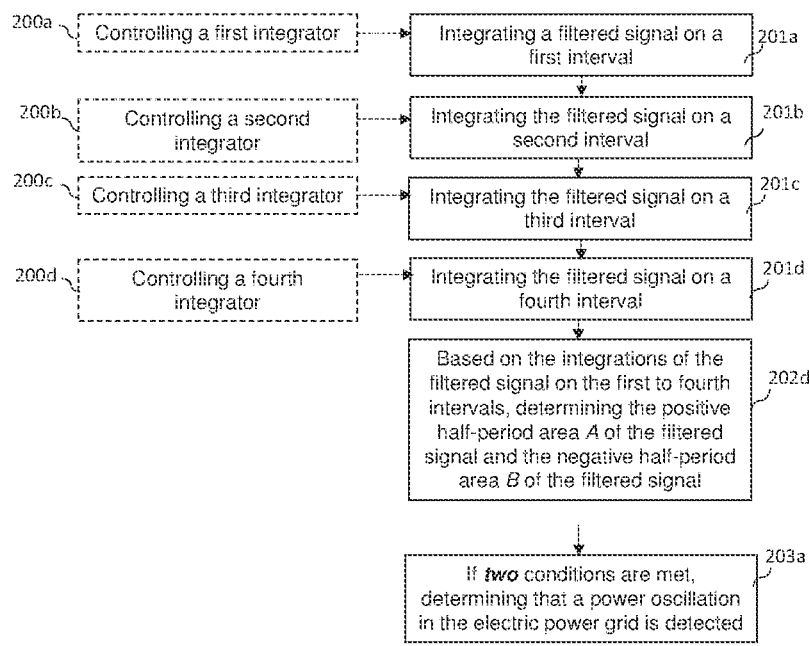
FIG. 7 is still another schematic flow chart illustrating further aspects of embodiments of the method according to the first aspect of the invention.

With reference to FIG. 7, some embodiments of the method may include the steps of:
- integrating 201a the filtered signal 134 on the first interval 136a;
- integrating 201b the filtered signal 134 on the second interval 136b;
- integrating 201c the filtered signal 134 on a third interval;
- integrating 201d the filtered signal 134 on a fourth interval;
- based on the integrations of the filtered signal 134 on the first, second, third and fourth intervals 136a, 136b, determining 202d the positive half-period area A of the filtered signal 134 and the negative half-period area B of the filtered signal 134; and
- determining 203a that a power oscillation in the electric power grid 102 is detected if the following two conditions (or criterion) are met (or valid):
  - a sum of the positive half-period area A of the filtered signal 134 and the negative half-period area B of the filtered signal 134 is below a first threshold; and
  - the absolute value of one A, B of the positive half-period area A and negative half-period area B is above a second threshold.

With reference to FIG. 7, for some embodiments, the third interval may have a duration in the range of 2 to 3 seconds. For example, for some embodiments, the third interval may have a duration of 2.5 seconds. For some embodiments, the fourth interval may have a duration in the range of 0.1 to 1 second. For example, for some embodiments, the fourth interval may have a duration of 0.5 second. However, for other embodiments, other values and other ranges for the third and fourth intervals are possible.

With reference to FIGS. 1 and 7, some embodiments of the method may comprise one or more of the steps of:
- controlling 200a a first integrator 116a (see FIG. 1) to integrate the filtered signal 134 on the first interval 136a;
- controlling 200b a second integrator 116b (see FIG. 1) to integrate the filtered signal 134 on the second interval 136b;
- controlling 200c a third integrator 116c (see FIG. 1) to integrate the filtered signal 134 on the third interval; and
- controlling 200d a fourth integrator 116d (see FIG. 1) to integrate the filtered signal 134 on the fourth interval.

Figure 8:
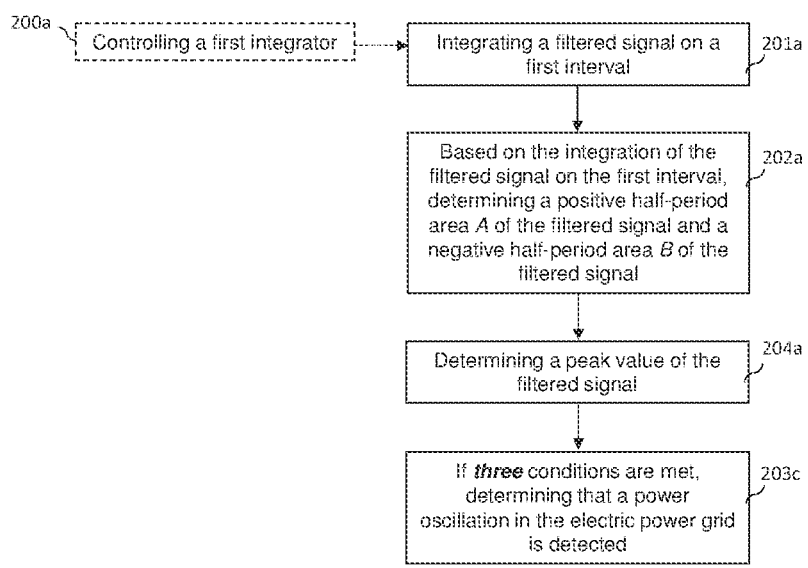
FIG. 8 is another schematic flow chart illustrating further aspects of embodiments of the method according to the first aspect of the invention.

With reference to FIGS. 8 and 11, some embodiments of the method may include the steps of:
- integrating 201a the filtered signal 134 on the first interval 136a;
- based on the integration of the filtered signal 134 on the first interval 136a, determining 202a a positive half-period area A of the filtered signal 134 and a negative half-period area B of the filtered signal 134;

determining 204a a peak value of the filtered signal 134 on the first interval 136a; and determining 203c that a power oscillation in the electric power grid 102 is detected if the following three conditions are met:
  the determined peak value is above a third threshold 138 (see FIG. 11);
  the sum of the positive half-period area A of the filtered signal 134 and the negative half-period area B of the filtered signal 134 is below the first threshold; and
  the absolute value of one A, B of the positive half-period area A and negative half-period area B is above the second threshold.

With reference to FIGS. 8 and 11, for some embodiments, the third threshold 138 may be in the range of 0.0005 to 0.007 pu, for example in the range of 0.001 to 0.003 pu, such as in the range of 0.001 to 0.002 pu. For some embodiments, it may be defined that the third threshold 138 is a value in the range of 0.0005 to 0.007 pu. For example, for some embodiments, the third threshold 138 may be 0.002 pu. For some embodiments, the second threshold may be at least two times the value of one of the peak value of the filtered signal 134 and third threshold 138. However, for other embodiments, other values and other ranges are possible.

Figure 9:
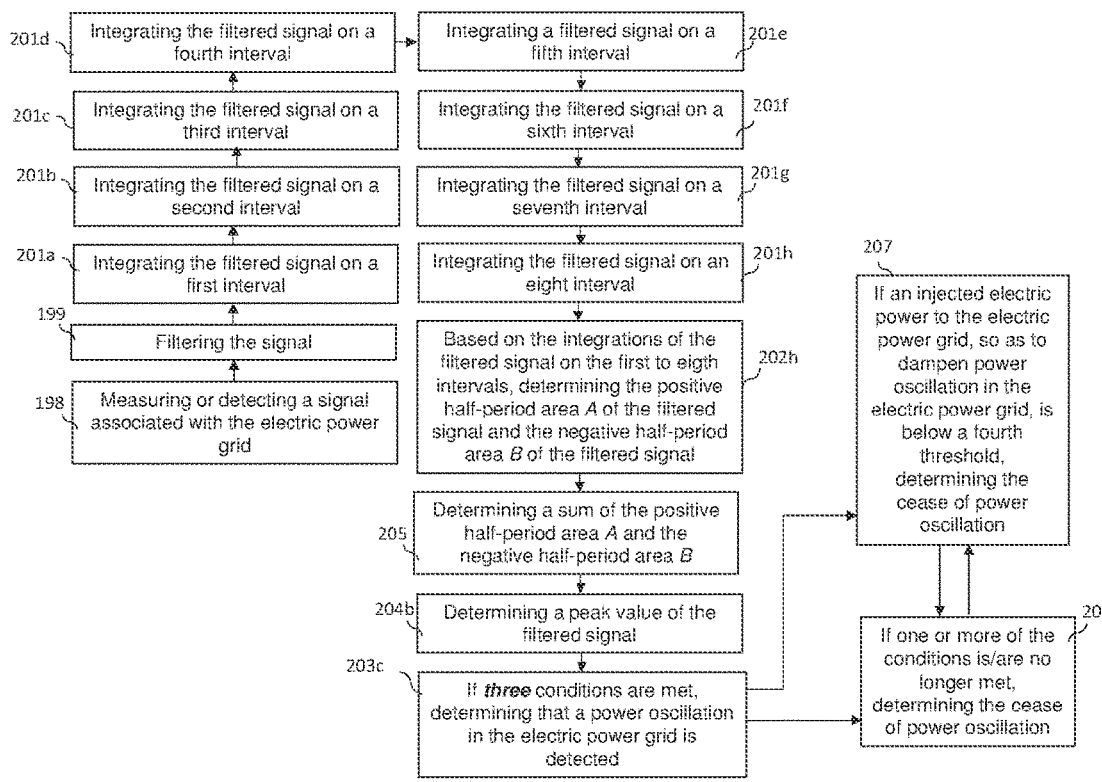
FIG. 9 is yet another schematic flow chart illustrating further aspects of embodiments of the method according to the first aspect of the invention.

With reference to FIGS. 3, 9 and 11, some embodiments of the method may include one or more of the steps of:
  measuring 198 or detecting a signal 135, for example a voltage signal or a frequency signal, to be filtered to the filtered signal 134, wherein the signal 135 is associated with the electric power grid 102. For some embodiments, the method may comprise measuring or detecting the signal 135 at a point of common coupling 114 between the electric power grid 102 and a power plant 110 connected to the electric power grid 102, wherein the power plant 102 comprises one or more electric power generating units 103;
  filtering 199 the signal 135 associated with the electric power grid 102 so as to produce the filtered signal 134;
  integrating 201a the filtered signal 134 on a first interval 136a;
  integrating 201b the filtered signal 134 on a second interval 136b;
  integrating 201c the filtered signal 134 on a third interval;
  integrating 201d the filtered signal 134 on a fourth interval;
  integrating 201e the filtered signal 134 on a fifth interval;
  integrating 201f the filtered signal 134 on a sixth interval;
  integrating 201g the filtered signal 134 on a seventh interval;
  integrating 201h the filtered signal 134 on an eight interval;
  based on the integrations of the filtered signal 134 on the first to eight intervals 136a, 136b, determining 202h a positive half-period area A of the filtered signal 134 and a negative half-period area B of the filtered signal 134;
  determining 205 a sum of the positive half-period area A of the filtered signal 134 and the negative half-period area B of the filtered signal 134;
  determining 204b a peak value of the filtered signal 134 on one or more of the first to eight intervals 136a, 136b, for example on one or more of the first to fourth intervals 136a, 136b;
  determining 203c that a power oscillation in the electric power grid is detected if the following three conditions are met:
    the determined peak value is above a third threshold 138 (see FIG. 11);
    the sum of the positive half-period area A of the filtered signal 134 and the negative half-period area B of the filtered signal 134 is below the first threshold; and
    the absolute value of one A, B of the positive half-period area A and negative half-period area B is above the second threshold;
  if one or more of the conditions is/are no longer met, determining 206 the cease, or cessation, of power oscillation in the electric power grid 102; and
  if an electric power, for example active and/or reactive power, injected to the electric power grid 102, for example to the point of common coupling 114, so as to dampen power oscillation in the electric power grid 102, is below a fourth threshold, determining 207 the cease of power oscillation in the electric power grid 102.

With reference to FIG. 9, in general, the measured signal 135 may be provided by the measurement of any physical magnitude or quantity. Such a physical magnitude may comprise any relevant electrical or physical state, for example, but not restricted to, a root mean square (RMS) value of an alternating voltage, such as at the point of common coupling 114, or frequency of alternating voltage, or active power flow, or reactive power flow, or any other derived magnitude from a physical measurement.

With reference to FIG. 9, for some embodiments, the fourth threshold may be in the range of zero to 0.02 pu, for example in the range of zero to 0.01 pu. For some embodiments, it may be defined that the fourth threshold is a value in the range of zero to 0.02 pu, such as a value below 0.01 pu. For example, for some embodiments, the fourth threshold may be 0.01 pu. However, for other embodiments, other values and other ranges for the fourth threshold are possible.

With reference to FIGS. 1 and 9, for some embodiments, the method may comprise one or more of the steps of:
  controlling a first integrator 116a (see FIG. 1) to integrate the filtered signal 134 on the first interval 136a;
  controlling a second integrator 116b (see FIG. 1) to integrate the filtered signal 134 on the second interval 136b;
  controlling a third integrator 116c (see FIG. 1) to integrate the filtered signal 134 on the third interval; and
  controlling a fourth integrator 116d (see FIG. 1) to integrate the filtered signal 134 on the fourth interval.
  controlling a fifth integrator 116e (see FIG. 1) to integrate the filtered signal 134 on the fifth interval;
  controlling a sixth integrator 116f (see FIG. 1) to integrate the filtered signal 134 on the sixth interval;
  controlling a seventh integrator 116g (see FIG. 1) to integrate the filtered signal 134 on the seventh interval; and
  controlling an eight integrator 116h (see FIG. 1) to integrate the filtered signal 134 on the eight interval.

With reference to FIG. 9, for some embodiments, the fifth interval may have a duration in the range of 2 to 3 seconds. For example, for some embodiments, the fifth interval may have a duration of 2.8 seconds. For some embodiments, the sixth interval may have a duration in the range of 0.1 to 1 seconds. For example, for some embodiments, the sixth interval may have a duration of 0.8 second. For some embodiments, the seventh interval may have a duration in the range of 2 to 3 seconds, or 0.1 to 1 second. For example, for some embodiments, the seventh interval may have a duration of 2.1 seconds. For some embodiments, the eight interval may have a duration in the range of 0.1 to 1 second, or 2 to 3 seconds. For example, for some embodiments, the eight interval may have a duration of 0.6 second. However, for other embodiments, other values and other ranges for the fifth to eight intervals are possible. It is to be understood that the each one of the above-mentioned ranges includes the end points, i.e. the start and end, of the respective range.

With reference to FIG. 9, for some embodiments, it may be defined that a specific integrator, for example any one of the integrators 116a-h, during a specific period of detection, always runs with the same interval. The specific integrator will then always be able to detect a matching frequency as 1/interval. The specific integrator will also match all other frequencies which match n×$f_n$, where n=1, 2, 4, 8 etc. However, some frequencies do not match this. Therefore, the use of several integrators 116a-h is advantageous, so as to match other $f_n$, for example odd numbered frequencies. Eventually, in some cases, there may still be some missing frequencies. However, the first threshold for the sum of the positive half-period area A and the negative half-period area B will catch the missing frequencies.

With reference to FIG. 9, for some embodiments, the step of determining the sum of the positive half-period area A of the filtered signal 134 and the negative half-period area B of the filtered signal 134 may include one or more of the steps of:

comparing the positive half-period area A of the filtered signal 134 with the negative half-period area B of the filtered signal 134 so as to obtain, or form, the sum of the positive half-period area A of the filtered signal 134 and the negative half-period area B of the filtered signal 134; and performing an addition, or a summation, of the positive half-period area A of the filtered signal 134 and the negative half-period area B of the filtered signal 134, i.e. adding the positive half-period area A of the filtered signal 134 to the negative half-period area B of the filtered signal 134, so as to obtain the sum of the positive half-period area A of the filtered signal 134 and the negative half-period area B of the filtered signal 134.

For some embodiments, one or more of the first to eight intervals 136a, 136b mentioned above may be referred to as a time interval. It is to be understood that the first to eight intervals are different from one another. Two or more of the intervals may at least partly overlap, or at least partly overlap one another. One or more of the intervals may at least partly overlap one or more of the other intervals. For some embodiments, the duration of one of the first to fourth, or first to eight, intervals may be different from the duration of another one of the first to fourth, or first to eight, intervals. The filtered signal 134 may comprises one of the group of: a filtered voltage signal; and a filtered frequency signal. For example, the filtered voltage signal may comprise a filtered root mean square (RMS) voltage.

With reference to FIG. 1, for some embodiments, the method may comprise detecting power oscillation at a point of common coupling 114 between the electric power grid 102 and a power plant 100 connected to the electric power grid 102, wherein the power plant 100 comprises one or more electric power generating units 103.

Unless disclosed otherwise, it should be noted that the method steps illustrated in FIGS. 4 to 9 and described herein do not necessarily have to be executed in the order illustrated in FIGS. 4 to 9. The steps may essentially be executed in any suitable order. Further, one or more steps may be added without departing from the scope of the appended claims. One or more steps may be excluded without departing from the scope of the appended claims. Method steps of the different embodiments of FIGS. 4 to 9 may be combined in various ways so as to form additional embodiments. Instead of one, two, four or eight intervals/integrators as disclosed for embodiments above, some embodiments may include three, five, six or seven intervals or integrators. For some embodiments, other ranges for the duration of one or more of the first to eight intervals than the ones mentioned above are possible. Although up to eight integrators and eight intervals are disclosed above, for some embodiments, more than eight integrators or more than eight intervals may be applied.

Figure 10:
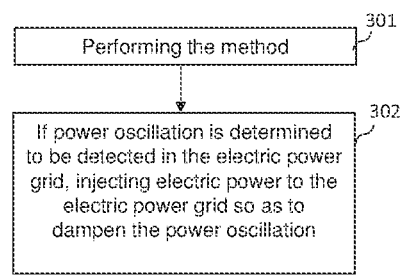
FIG. 10 is a schematic flow chart illustrating aspects of embodiments of the process according to the second aspect of the invention.

With reference to FIG. 10, aspects of embodiments of the process for damping power oscillation, or power oscillations, in an electric power grid 102 according to the second aspect of the invention are schematically illustrated. The process comprises:

performing 301 a method according to any one of embodiments disclosed above; and if power oscillation is determined to be detected in the electric power grid, injecting 302 electric power to the electric power grid 102 so as to dampen the power oscillation, wherein the injected electric power may be active and/or reactive power.

Figure 12:
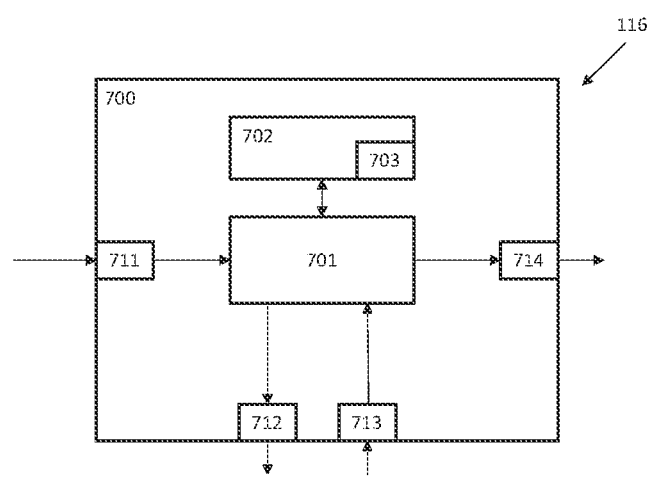
FIG. 12 is a schematic diagram illustrating an embodiment of the control arrangement according to the fourth aspect of the invention, in which a method according to any one of the herein described embodiments may be implemented.

With reference to FIGS. 1 and 12, aspects of embodiments of the control arrangement 116 for detecting power oscillation in an electric power grid 102 according to the fifth aspect of the invention are schematically illustrated. Embodiments of the control arrangement 116 are configured to:

integrate 201a a filtered signal 134 on a first interval 136a, the filtered signal 134 being associated with the electric power grid 102;

based on the integration of the filtered signal 134 on the first interval 136a, determine 202a a positive half-period area A of the filtered signal 134 and a negative half-period area B of the filtered signal 134, wherein one A, B of the positive half-period area A and negative half-period area B is immediately subsequent to the other one A, B of the positive half-period area A and negative half-period area B; and determine 203a that a power oscillation in the electric power grid 102 is detected if the following two conditions are met, or valid:

a sum of the positive half-period area A of the filtered signal 134 and the negative half-period area B of the filtered signal 134 is below a first threshold; and the absolute value of one A, B of the positive half-period area A and negative half-period area B is above a second threshold.

With reference to FIG. 1, some embodiments of the control arrangement 116 may include a first integrator 116a for integrating the filtered signal 134 on the first interval 136a, a second integrator 116b for integrating the filtered signal 134 on the second interval 136b, a third integrator 116c for integrating the filtered signal 134 on the third interval, a fourth integrator 116d for integrating the filtered signal 134 on the fourth interval, a fifth integrator 116e for integrating the filtered signal 134 on the fifth interval, a sixth integrator 116f for integrating the filtered signal 134 on the sixth interval, a seventh integrator 116g for integrating the filtered signal 134 on the seventh interval, and/or an eight integrator 116h for integrating the filtered signal 134 on the eight interval in order to perform steps 201a to 201h in FIGS. 4 to 9.

With reference to FIG. 1, some embodiments of the control arrangement 116 may include a measuring unit 116i for measuring or detecting a signal 135, for example a voltage signal or a frequency signal, to be filtered to the filtered signal 134 in order to perform step 198 in FIG. 9. The signal 135 is associated with the electric power grid 102. The measuring unit 116*i* may be configured to be connected to and/or to communicate with a sensor or detector for measuring or detecting the signal 135 associated with the electric power grid 102, for example at the point of common coupling 114, or elsewhere.

With reference to FIG. 1, some embodiments of the control arrangement 116 may include a filter unit 116*j* for filtering the signal 135 associated with the electric power grid 102 so as to produce the filtered signal 134 in order to perform step 199 in FIG. 9. For example, the filter unit 116*j* may comprise a set of non-complex second order filters, or one or more other filters.

With reference to FIG. 1, some embodiments of the control arrangement 116 may include a first determination unit 116*k* for determining the positive half-period area A of the filtered signal 134 and the negative half-period area B of the filtered signal 134 in order to perform the steps 202*a*, 202*b*, 202*d* and 202*h* in FIGS. 4 to 9.

With reference to FIG. 1, some embodiments of the control arrangement 116 may include a second determination unit 116*m* for determining a sum of the positive half-period area A of the filtered signal 134 and the negative half-period area B of the filtered signal 134 in order to perform step 205 in FIG. 9.

With reference to FIG. 1, some embodiments of the control arrangement 116 may include a third determination unit 116*n* for determining a peak value of the filtered signal 134 in order to perform steps 204*a* and 204*b* in FIGS. 8 and 9.

With reference to FIG. 1, some embodiments of the control arrangement 116 may include a fourth determination unit 116*p* for determining the cease of power oscillation in the electric power grid 102 in order to perform steps 206 and 207 in FIG. 9. For some embodiments, the fourth determination unit 116*p* may be configured to be connected to and/or to communicate with a sensor or detector for measuring or detecting the electric power, for example active and/or reactive power, injected to the electric power grid 102, for example to the point of common coupling 114, so as to dampen power oscillation in the electric power grid 102.

With reference to FIG. 1, for some embodiments, the control arrangement 116 is configured to directly or indirectly communicate, for example via signal lines (or cables or wires) or wirelessly, with one or more of the group of: the electric power grid 102; the power plant 100; the wind turbine generator 104; sensors; and other devices or systems of the electric power grid 102, of the power plant 100 or of the wind turbine generator 104.

FIG. 12 shows in schematic representation an embodiment of the control arrangement 116 according to the fifth aspect of the invention, which may include a control unit 700, which may correspond to or may include one or more of the above-mentioned integrators 116*a-h* and units 116*i-p* of the control arrangement 116. The control unit 700 may comprise a computing unit 701, which can be constituted by essentially any suitable type of processor or microcomputer, for example a circuit for digital signal processing (Digital Signal Processor, DSP), or a circuit having a predetermined specific function (Application Specific Integrated Circuit, ASIC). The computing unit 701 is connected to a memory unit 702 arranged in the control unit 700. The memory unit 702 provides the computing unit 701 with, for example, the stored program code and/or the stored data which the computing unit 701 requires to be able to perform computations. The computing unit 701 is also arranged to store partial or final results of computations in the memory unit 702.

With reference to FIG. 12, in addition, the control unit 700 may be provided with devices 711, 712, 713, 714 for receiving and transmitting input and output signals. These input and output signals may contain waveforms, impulses, or other attributes which, by means of the devices 711, 713 for the reception of input signals, can be detected as information and can be converted into signals which can be processed by the computing unit 701. These signals are then made available to the computing unit 701. The devices 712, 714 for the transmission of output signals are arranged to convert signals received from the computing unit 701 in order to create output signals by, for example, modulating the signals, which, for example, can be transmitted to other parts and/or systems of, or associated with, the electric power grid 102 and/or the power plant 100 (see FIG. 1). Each of the connections to the devices for receiving and transmitting input and output signals can be constituted by one or more of a cable; a data bus; and a wireless connection.

Here and in this document, units are often described as being provided for performing steps of the method according to embodiments of the invention. This also includes that the units are designed to and/or configured to perform these method steps.

With reference to FIG. 1, the integrators 116*a-h* and units 116*i-p* of the control arrangement 116 are in FIG. 1 illustrated as separate units. These separate units may, however, be logically separated but physically implemented in the same unit, or can be both logically and physically arranged together. The integrators 116*a-h* and units 116*i-p* may for example correspond to groups of instructions, which can be in the form of programming code, that are input into, and are utilized by a processor/computing unit 701 (see FIG. 12) when the units are active and/or are utilized for performing its method step.

With reference to FIGS. 1 and 12, the control arrangement 116, which may include one or more control units 700, for example one or more devices, controllers or control devices, according to embodiments of the present invention may be arranged to perform all of the method steps mentioned above, in the claims, and in connection with the herein described embodiments. The control arrangement 116 is associated with the above-described advantages for each respective embodiment of the method.

With reference to FIG. 12, according to the third aspect of the invention, a computer program 703 is provided, comprising instructions which, when the program is executed by a computer, cause the computer to carry out one or more of the method according to any one of the embodiments disclosed above and process according to any one of the embodiments disclosed above. For some embodiments, a computer program 703 is provided, comprising instructions which, when the program is executed by a computer, cause the computer to carry out the method according to any one of the embodiments disclosed above According to the fourth aspect of the invention, a computer-readable medium is provided, comprising instructions which, when the instructions are executed by a computer, cause the computer to carry out one or more of the method according to any one of the embodiments disclosed above and process according to any one of the embodiments disclosed above. For some embodiments, a computer-readable medium is provided, comprising instructions which, when the instructions are executed by a computer, cause the computer to carry out the method according to any one of the embodiments disclosed above.

The person skilled in the art will appreciate that the herein described embodiments of the method according to the first aspect may be implemented in a computer program 703 (see FIG. 12), which, when it is executed in a computer, instructs the computer to execute the method. The computer program is usually constituted by a computer program product 703 stored on a non-transitory/non-volatile digital storage medium, in which the computer program is incorporated in the computer-readable medium of the computer program product. The computer-readable medium comprises a suitable memory, such as, for example: ROM (Read-Only Memory), PROM (Programmable Read-Only Memory), EPROM (Erasable PROM), Flash memory, EEPROM (Electrically Erasable PROM), a hard disk unit, etc.

The present invention is not limited to the above-described embodiments. Instead, the present invention relates to, and encompasses all different embodiments being included within the scope of the independent claims.

The invention claimed is:

1. A method for detecting power oscillation in an electric power grid, wherein the method comprises:
   integrating a filtered signal on a first interval, the filtered signal being associated with the electric power grid;
   based on the integration of the filtered signal on the first interval, determining a positive half-period area of the filtered signal and a negative half-period area of the filtered signal, one of the positive half-period area and negative half-period area being immediately subsequent to the other one of the positive half-period area and negative half-period area; and
   determining that a power oscillation in the electric power grid is detected when the following two conditions are met:
   a sum of the positive half-period area of the filtered signal and the negative half-period area of the filtered signal is below a first threshold; and
   the absolute value of one of the positive half-period area and negative half-period area is above a second threshold.

2. The method of claim 1, wherein the first interval has a duration in a range of 9 to 15 seconds.

3. The method of claim 1, wherein the method comprises:
   integrating the filtered signal on a second interval; and
   based on the integrations of the filtered signal on the first and second intervals, determining the positive half-period area of the filtered signal and the negative half-period area of the filtered signal.

4. The method of claim 3, wherein the second interval has a duration in a range of 5 to 7 seconds.

5. The method of claim 3, wherein the method comprises:
   integrating the filtered signal on a third interval;
   integrating the filtered signal on a fourth interval; and
   based on the integrations of the filtered signal on the first, second, third and fourth intervals, determining the positive half-period area of the filtered signal and the negative half-period area of the filtered signal.

6. The method of claim 5, wherein the third interval has a duration in the range of 2 to 3 seconds, and
   wherein the fourth interval has a duration in a range of 0.1 to 1 second.

7. The method of claim 5, wherein the method further comprises:
   controlling a first integrator to integrate the filtered signal on the first interval;
   controlling a second integrator to integrate the filtered signal on the second interval;
   controlling a third integrator to integrate the filtered signal on the third interval; and
   controlling a fourth integrator to integrate the filtered signal on the fourth interval.

8. The method of claim 5, wherein the method comprises:
   determining a peak value of the filtered signal on one or more of the first, second, third and fourth intervals; and
   determining that a power oscillation in the electric power grid is detected if the following three conditions are met:
   the determined peak value is above a third threshold;
   the sum of the positive half-period area of the filtered signal and the negative half-period area of the filtered signal is below the first threshold; and
   the absolute value of one of the positive half-period area and negative half-period area is above the second threshold.

9. The method of claim 5, wherein a duration of one of the first, second, third and fourth intervals is different from a duration of another one of the first, second, third and fourth intervals.

10. The method of claim 1, wherein the method is performed two or more consecutive times, and
    wherein the method comprises:
    when the two conditions are met every time the method is performed, determining that a power oscillation in the electric power grid is detected.

11. The method of claim 1, wherein the method comprises:
    when one or more of the two conditions is/are no longer met, determining a cease of power oscillation in the electric power grid.

12. The method of claim 1, wherein the method comprises:
    when an electric power injected to the electric power grid so as to dampen power oscillation in the electric power grid is below a threshold, determining a cease of power oscillation in the electric power grid.

13. The method of claim 1, further comprising:
    when power oscillation is determined to be detected in the electric power grid, injecting electric power to the electric power grid so as to dampen the power oscillation.

14. A non-transitory computer-readable medium comprising instructions which, when the instructions are executed by a computer, cause the computer to carry out an operation for detecting power oscillation in an electric power grid, wherein the operation comprises:
    integrating a filtered signal on a first interval, the filtered signal being associated with the electric power grid;
    based on the integration of the filtered signal on the first interval, determining a positive half-period area of the filtered signal and a negative half-period area of the filtered signal, one of the positive half-period area and negative half-period area being immediately subsequent to the other one of the positive half-period area and negative half-period area; and
    determining that a power oscillation in the electric power grid is detected when the following two conditions are met:

a sum of the positive half-period area of the filtered signal and the negative half-period area of the filtered signal is below a first threshold; and the absolute value of one of the positive half-period area and negative half-period area is above a second threshold.

15. A control arrangement for detecting power oscillation in an electric power grid, wherein the control arrangement is configured to:

integrate a filtered signal on a first interval, the filtered signal being associated with the electric power grid;

based on the integration of the filtered signal on the first interval, determine a positive half-period area of the filtered signal and a negative half-period area of the filtered signal, one of the positive half-period area and negative half-period area being immediately subsequent to the other one of the positive half-period area and negative half-period area; and determine that a power oscillation in the electric power grid is detected if the following two conditions are met:

a sum of the positive half-period area of the filtered signal and the negative half-period area of the filtered signal is below a first threshold; and the absolute value of one of the positive half-period area and negative half-period area is above a second threshold.

16. A power plant for providing electric power to an electric power grid, wherein the power plant comprises:

one or more electric power generating units, and a control arrangement for detecting power oscillation in the electric power grid, wherein the control arrangement is configured to:

integrate a filtered signal on a first interval, the filtered signal being associated with the electric power grid;

based on the integration of the filtered signal on the first interval, determine a positive half-period area of the filtered signal and a negative half-period area of the filtered signal, one of the positive half-period area and negative half-period area being immediately subsequent to the other one of the positive half-period area and negative half-period area; and determine that a power oscillation in the electric power grid is detected when the following two conditions are met:

a sum of the positive half-period area of the filtered signal and the negative half-period area of the filtered signal is below a first threshold; and the absolute value of one of the positive half-period area and negative half-period area is above a second threshold.

* * * * *